United States Patent
Pant et al.

(10) Patent No.: US 11,177,805 B1
(45) Date of Patent: Nov. 16, 2021

(54) REDUCING GLITCH POWER IN DIGITAL CIRCUITS

(71) Applicant: QUALCOMM Incorporated, San Diego, CA (US)

(72) Inventors: Harshat Pant, San Diego, CA (US); Ravindraraj Ramaraju, Round Rock, TX (US); Luis Filipe Brochado Reis, Cork (IR); Tuck Boon Chan, San Diego, CA (US); Mayank Sen Sharma, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 16/912,521

(22) Filed: Jun. 25, 2020

(51) Int. Cl.
  *H03K 5/00* (2006.01)
  *H03K 19/003* (2006.01)

(52) U.S. Cl.
  CPC ............. *H03K 19/003* (2013.01); *H03K 5/00* (2013.01); *H03K 2005/00019* (2013.01)

(58) Field of Classification Search
  None
  See application file for complete search history.

(56) References Cited

U.S. PATENT DOCUMENTS

| | | | | |
|---|---|---|---|---|
| 4,760,279 A | * | 7/1988 | Saito | H03K 5/1252 326/21 |
| 5,469,476 A | * | 11/1995 | Liao | H03K 5/153 375/238 |
| 7,397,292 B1 | * | 7/2008 | Potanin | H03K 5/1252 327/261 |
| 7,724,025 B2 | * | 5/2010 | Masleid | H03K 5/1252 326/26 |
| 2010/0097131 A1 | * | 4/2010 | Bainbridge | H03K 19/0033 327/551 |

OTHER PUBLICATIONS

Lee H., et al., "Glitch Elimination by Gate Freezing, Gate Sizing and Buffer Insertion for Low Power Optimization Circuit", The 30th Annual Conference of the IEEE Industrial Electronics Society, Nov. 2-6, 2004, Busan, Korea, pp. 2126-2131.

* cited by examiner

*Primary Examiner* — Anh Q Tran
(74) *Attorney, Agent, or Firm* — Seyfarth Shaw LLP

(57) ABSTRACT

A glitch absorbing buffer reduces glitch power in digital circuits. The glitch absorbing buffer includes a logic element configured to identify a digital logic glitch and a delay circuit configured to selectively delay one input to a logic element. The amount of delay imposed is equivalent to a pulse width of the glitch. A Schmitt trigger may amplify the low pass behavior on the input.

20 Claims, 14 Drawing Sheets

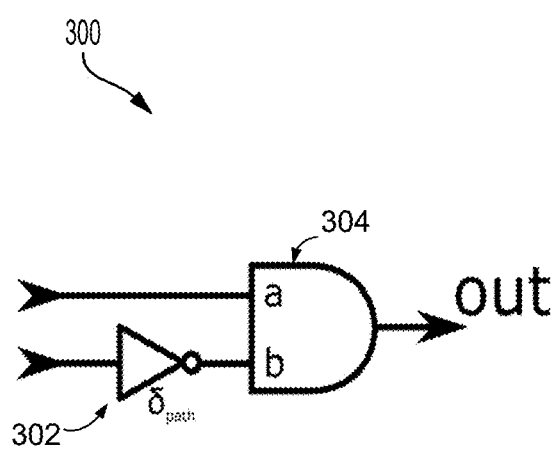 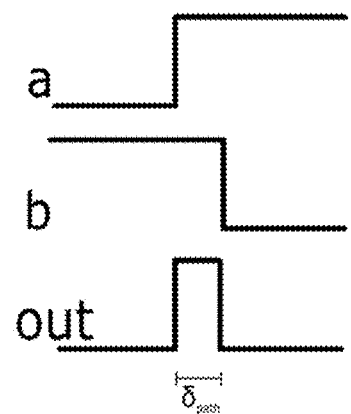
*FIG. 3A*  *FIG. 3B*

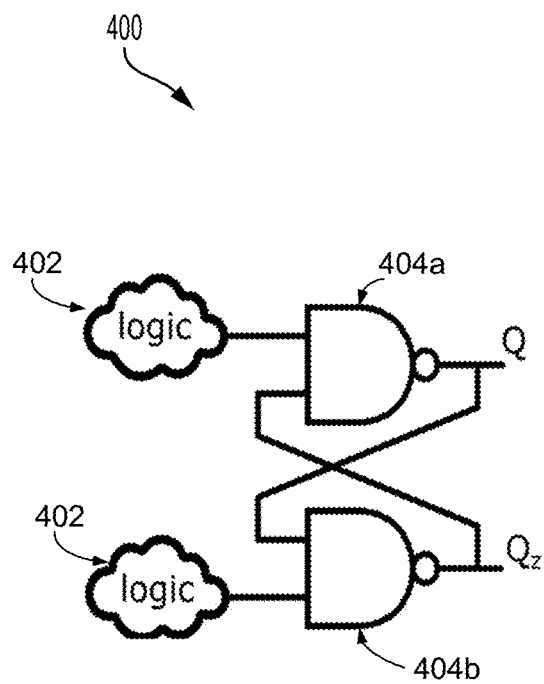
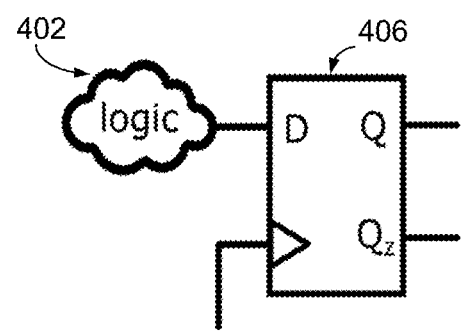
FIG. 4A
FIG. 4B

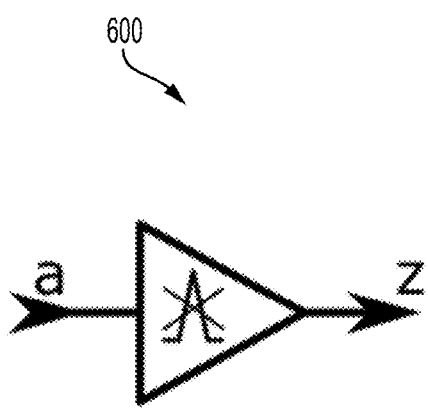
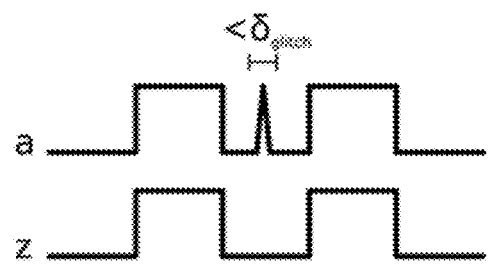
*FIG. 6A*
*FIG. 6B*
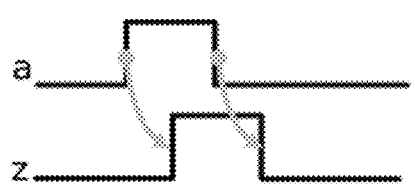
*FIG. 7*

$y_n = a \cdot b + (a + b) \cdot y_{n-1}$

| a | b | $y_n$ |
|---|---|---|
| 0 | 0 | 0 |
| 0 | 1 | $y_{n-1}$ |
| 1 | 0 | $y_{n-1}$ |
| 1 | 1 | 1 |

REDUCING GLITCH POWER IN DIGITAL CIRCUITS

TECHNICAL FIELD

The present disclosure generally relates to low power design. More specifically, the present disclosure relates to reducing glitch power in digital circuits.

BACKGROUND

Glitch power may be a significant power drain during operation of digital circuits. Glitches are unwanted pulses or spikes at the output of combinational logic that occur because of unbalanced timing paths in the logic cell inputs. The power drain may be as low as 20% of the dynamic power up to 100% of the dynamic power, depending on the module design. This power is wasted and may also result in thermal problems from the higher power dissipated. Glitch power can be produced by unbalanced combinational logic cones. Until now, there have been no effective methods to reduce glitch power.

SUMMARY

A glitch absorbing buffer is disclosed and includes a logic element that is configured to identify a digital logic glitch and also includes a delay circuit in communication with the logic element. The delay circuit is configured to selectively delay one input to the logic element, thus absorbing the glitch.

A method for reducing glitch power in digital circuits is provided. The method begins when a determination is made if two inputs arrive separately at a logic element. An amount of delay between the arrival of the two inputs is determined when the two inputs arrived separately. A glitch is then defined as the amount of delay between the arrival of the two inputs. The method then determines if there is an overlap between the two input signals. If the two input signals overlap, a logic element toggles.

A glitch absorbing buffer includes means for determining if two inputs arrive separately at a logic element. The glitch absorbing buffer further comprises means for determining an amount of delay between the arrival of the two inputs. The apparatus then defines a glitch as the amount of delay between the arrival of the two inputs. The apparatus further comprises means for determining if there is an overlap between the two input signals and means for toggling a logic element if there is overlap between the two input signals.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIG. 3A is a block diagram showing an AND gate with a delay logic inverter device, according to aspects of the present disclosure.

FIG. 3B is a timing diagram showing a glitch on a signal waveform, according to aspects of the present disclosure.

FIG. 4A is a block diagram showing a segment of a flip-flop hold circuit, according to aspects of the present disclosure.

FIG. 4B is a block diagram showing a clocked flip-flop, according to an aspect of the present disclosure.

FIG. 6A is a block diagram showing a glitch absorbing buffer (GABUF) cell concept according to aspects of the present disclosure.

FIG. 6B is a timing diagram showing a glitch on a signal waveform, according to aspects of the present disclosure.

FIG. 7 is a timing diagram showing a timing delay on a signal affected by a glitch, according aspects of the present disclosure.

DETAILED DESCRIPTION

Figure 1:
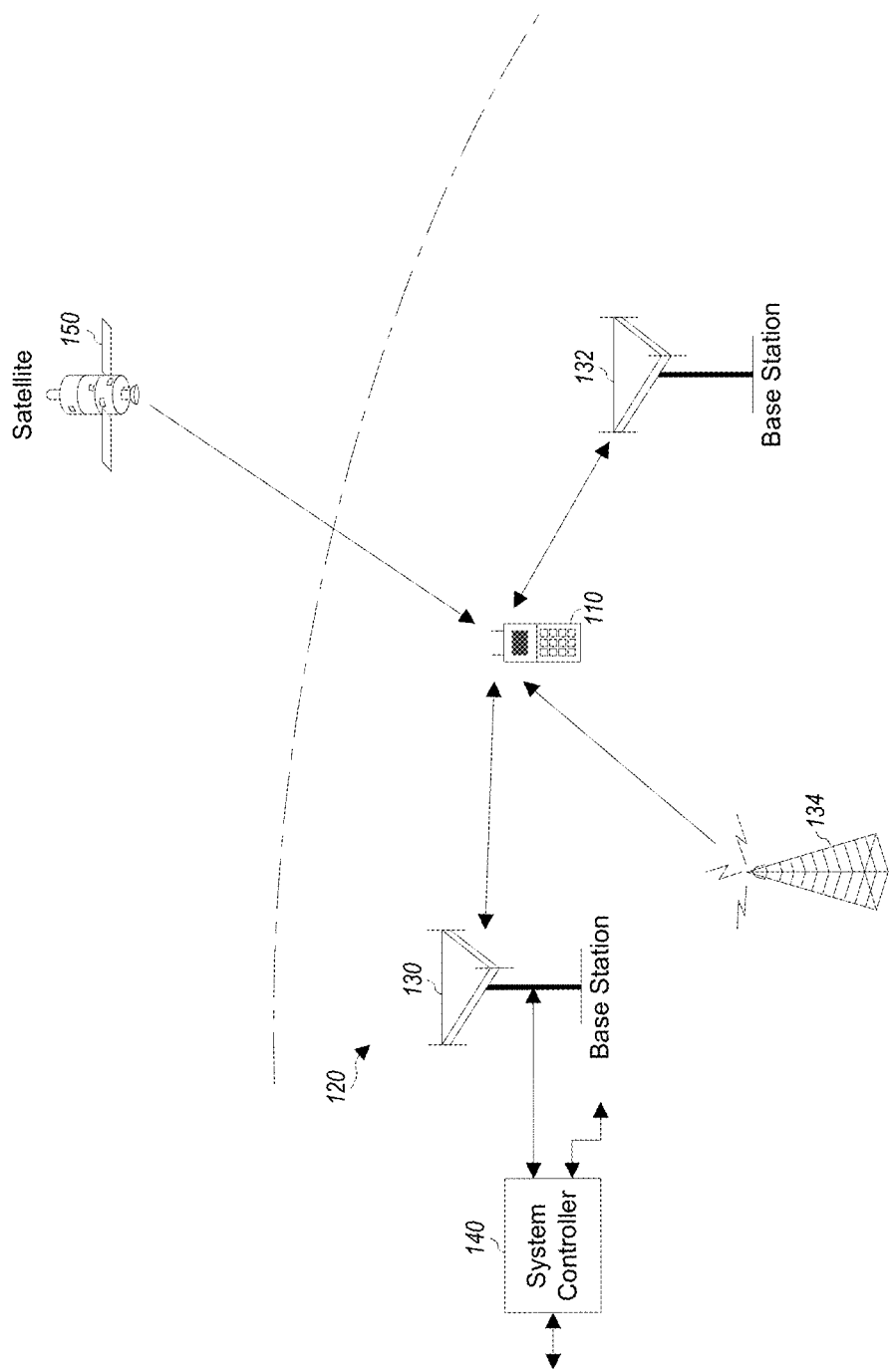
FIG. 1 is a block diagram showing a wireless device communicating with a wireless communications system, in accordance with certain aspects of the present disclosure.

The detailed description set forth below, in connection with the appended drawings, is intended as a description of various configurations and is not intended to represent the only configurations in which the concepts described may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described, the use of the term "and/or" is intended to represent an "inclusive OR", and the use of the term "or" is intended to represent an "exclusive OR".

Electronic devices typically incorporate semiconductor chips, system-on-chip devices, and application-specific integrated circuits (ASIC). These semiconductor devices incorporate logic gates that rely on specific gates responding to signal inputs of voltage to perform operations. Gates switch when an input signal of a desired voltage level is received. The switch may toggle to a different logic setting when the voltage is less than the desired value, producing an unwanted signal transition or glitch.

Reducing glitch power may be accomplished using a glitch absorbing buffer (GABUF), or glitch suppressor. In one aspect, the GABUF receives an input signal and internally creates a delayed version of the input signal. The delayed version is then compared with the original signal using a logic element. The logic element may be a C-element. The glitches are absorbed if the delayed signal and the original signal do not match. Such disagreements between the two signals can only occur if the input signal is a small width glitch. If the two signals agree, there is no glitch and the signals are unaffected on output from the GABUF.

In another aspect, the GABUF may act to filter glitches by treating input signals as glitches based on a signal pulse duration. This may be accomplished using a glitch absorbing buffer circuit that may be combined with complex scripts that analyze the logic cone design and identify a number of points at which the GABUF may be added to reduce the overall glitch power of the design without affecting functionality. The GABUF may incorporate a C-element as the logic element. The present disclosure may also use a complex framework of timing analysis so that the cell may be inserted and other logic cones balanced so that the GABUF does not create additional glitches downstream.

Glitch removal is the elimination of these unnecessary signal transitions without functionality from electronic circuits. These glitches cause increased power usage in circuits. Power dissipation of a gate may occur in two ways: static power dissipation and dynamic power dissipation. Glitch power is a form of dynamic power dissipating in the circuit and is directly proportional to switching activity. Glitch power dissipation may range from 20% to 70% of total power dissipation; up to 60% for a graphics processing unit (GPU); from 30% to 40% for video blocks; and may be at least 15% for a camera. These glitches should be reduced or eliminated to ensure a low power design.

Switching activity occurs due to signal transitions, which are one of two types, functional transitions and glitch transitions. Switching power (P) dissipation is directly proportional to the switching activity ($\alpha$), load capacitance (C), supply voltage (V), and clock frequency (f) as:

$$P = \alpha \cdot C \cdot V^2 \cdot f \tag{1}$$

Switching activity means transitioning to different levels. Glitches are dependent on signal transitions and more glitches result in higher power dissipation. As shown in the above Equation 1, switching power dissipation may be controlled by controlling switching activity ($\alpha$), voltage scaling, and other techniques. Glitch reduction techniques include reducing switching activity, gate freezing, hazard filtering, balanced path delay, gate sizing, and using a multiple threshold transistor.

An increase in transitions may result in more glitches, producing more power dissipation. To reduce glitches, switching activity may be reduced. As one example, Gray code may be used in counters in place of binary code, because each increment in Gray code flips only one bit. Gray code may not be suitable for all digital designs.

Glitches may also be eliminated using gate freezing. This method relies on the availability of modified standard library cells. In this method, high glitch gates may be transformed into modified standard library cells, such as an F-gate, which filter out glitches when a control signal is applied. When the control signal is high, the F-gate operates normally, however, when the control signal is low, the gate output is disconnected from the ground. As a result, the cell is not discharged to zero, thus preventing glitches. In some designs, it may not be possible to incorporate a control signal into the design without adverse power effects elsewhere in the design.

Glitches in digital circuits are unnecessary transitions due to varying path delays in the circuit. Balanced path delay techniques may resolve differing path delays. Equalizing path delay involves buffer insertion on faster paths. Balancing path delays may avoid glitches in the output. The balancing path delays method operates by adjusting gate propagation delays and produces balanced path delays at the output. Path balancing may consume more power to the additional buffers inserted. Buffer insertion should be implemented carefully as it is possible to cause additional glitches elsewhere in the design as glitches may ripple through the fan-out cone.

Gate upsizing and downsizing may be used in path balancing. A gate may be replaced by a logically equivalent but differently sized cell, thus changing the delay of the gate. As a result, gate upsizing may be used only when the power saved through glitch removal is greater than the increase in power dissipation produced by the increase in size. Gate sizing affects transitions with glitches but does not affect the functional transition.

The delay of a gate is a function of its threshold voltage. Non-critical paths may be selected and the threshold voltage of the gates in these paths may be increased when a multiple threshold transistor is used. The result is balanced propagation delay along different paths that converge at the receiving gate. Performance is maintained because it is determined by the time specified by the critical path. A higher threshold voltage may also reduce the leakage current of a path. While the techniques described above may manage glitches, it is desirable to reduce or eliminate glitches to ensure better power management and low power design.

Aspects of the present disclosure use a logic element. This logic element may be C-element or C-gate, or hysteresis flip-flop. The C-element is a semiconductor distributive circuit, whose operation in time is described by a Hasse diagram C-elements may be realized as a sum-of-product (SOP) circuit. An alternative implementation uses a Schmitt trigger.

A Schmitt trigger is a comparator circuit with hysteresis implemented by applying positive feedback to the non-inverting input of a comparator or differential amplifier. It is an active circuit that converts an analog signal to a digital output signal. The "trigger" operates because the output retains its value until the input changes sufficiently to trigger a change. In the non-inverting configuration, when the input is higher than a chosen threshold, the output is high. When the input is below a lower chosen threshold, the output is low, and when the input is between the two levels, the output retains its value. This dual threshold action is known as hysteresis and implies that the Schmidt trigger possesses a memory and can act as a bistable multivibrator (e.g., latch or flip-flop).

The C-element based glitch absorbing buffer (GABUF), which may also be known as a glitch suppressor circuit, described is combined with complex scripts that analyze the logic cone design and identify a number of points at which this glitch suppressor cell may be added to reduce the overall glitch power of the design without affecting functionality. This may specify a complex framework of timing analysis so that the cell may be inserted and other logic cones balanced so that the C-element cell does not create additional glitches downstream. The method and apparatus described may reduce dynamic power consumption in chips.

Aspects of the present disclosure are directed to improving power management and low power design by providing a glitch absorbing buffer (GABUF) having a delay element. The GABUF may be selectively added to a design, such as on a data path where the logic may be prone to glitches.

A glitch is an unwanted switching in a digital logic circuit due to routing resource timing delay variances. Glitches occur on combinational logic because the logic elements react asynchronously to their input signals. Downstream logic may be susceptible to glitches, on both synchronous and asynchronous signal paths. This delay may occur due to differences in the signal routing paths or layout. This behavior results in additional switching, which increases power consumption. Power is wasted because each pulse demands a rise and fall event, which may also result in additional power wasted downstream from the glitch. Glitches may also inject more noise into a design through coupling on signal paths. In addition, glitches may compound as signals traverse the logic hierarchy and may affect the power of the receiving flops where the master latch is transparent to the glitches.

The aspects of the present disclosure may be implemented as shown in FIGS. 1 through 14. More specifically, aspects of the present disclosure may be implemented in the electronic devices of FIG. 14.

FIG. 1 is a block diagram showing a wireless device communicating with a wireless communications system, in accordance with certain aspects of the present disclosure. The wireless device 110 may incorporate the glitch absorbing buffer. The wireless device 110 communicates with a wireless communications system 120. The wireless communications system 120 may be a 5G NR system, a long term evolution (LTE) system, a code division multiple access (CDMA) system, a global system for mobile communications (GSM) system, a wireless local area network (WLAN) system, millimeter wave (mmW) technology, or some other wireless system. A CDMA system may implement wideband CDMA (WCDMA), time division synchronous CDMA (TD-SCDMA), CDMA2000, or some other version of CDMA. In a millimeter wave (mmW) system, multiple antennas are used for beamforming (e.g., in the range of 30 GHz, 60 GHz, etc.). For simplicity, FIG. 1 shows the wireless communications system 120 including two base stations 130 and 132 and one system controller 140. In general, a wireless system may include any number of base stations and any number of network entities.

The wireless device 110 may be referred to as a mobile equipment, a user equipment (UE), a mobile station, a terminal, an access terminal, a subscriber unit, a station, etc. The wireless device 110 may also be a cellular phone, a smartphone, a tablet, a wireless modem, a personal digital assistant (PDA), a handheld device, a laptop computer, a Smartbook, a netbook, a cordless phone, a wireless local loop (WLL) station, a Bluetooth® device, etc. The wireless device 110 may be capable of communicating with the wireless communications system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communications, such as 5G NR, LTE, CDMA2000, WCDMA, TD-SCDMA, GSM, 802.11, etc.

Figure 2:
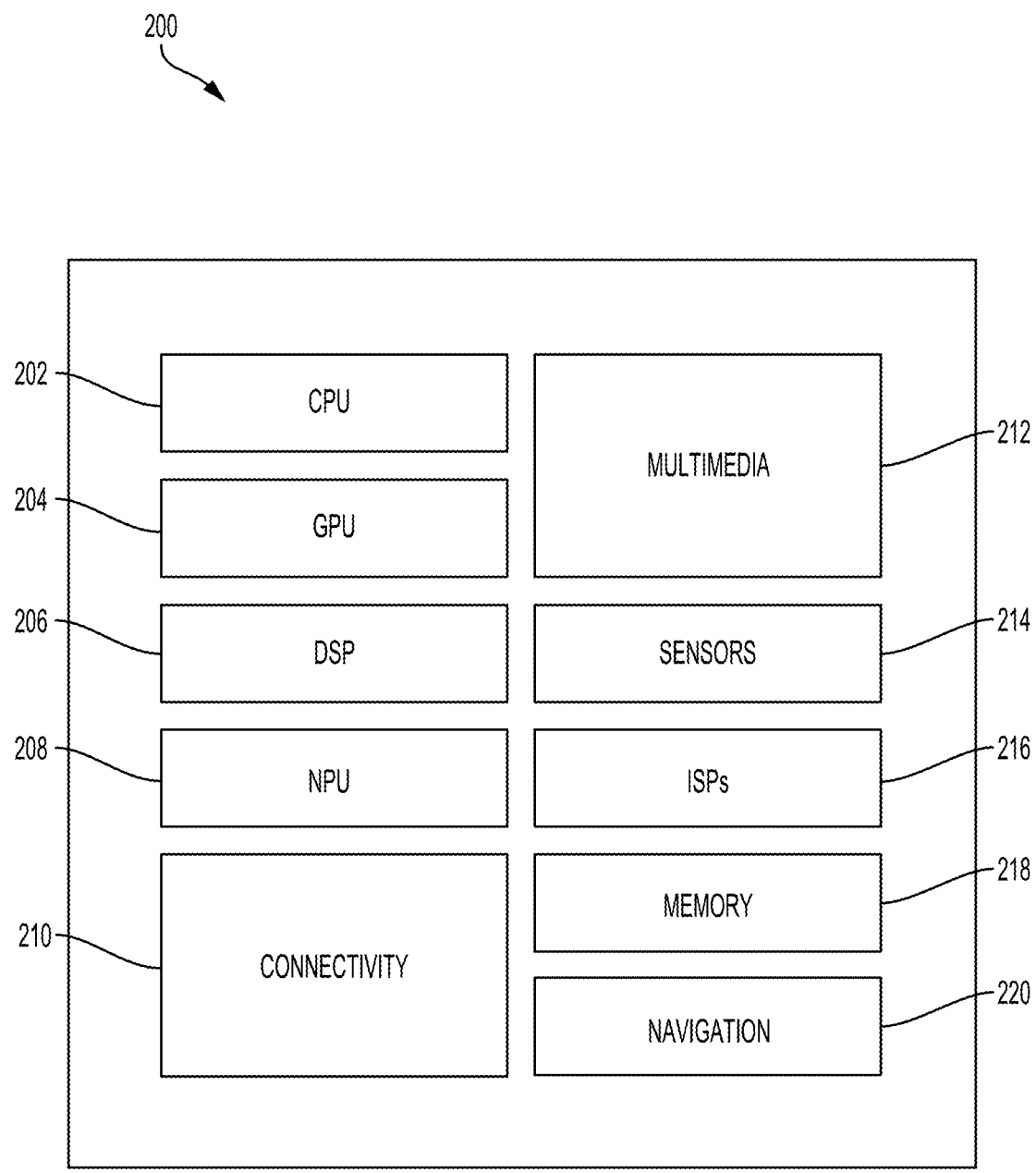
FIG. 2 is a block diagram illustrating an example implementation of a system-on-chip (SoC), in accordance with certain aspects of the present disclosure.

FIG. 2 is a block diagram illustrating an example implementation of a system-on-chip (SoC) in accordance with certain aspects of the present disclosure. The SoC 200 includes processing blocks tailored to specific functions, such as a connectivity block 210. The connectivity block 210 may include fifth generation (5G) connectivity, fourth generation long term evolution (4G LTE) connectivity, Wi-Fi connectivity, USB connectivity, Bluetooth® connectivity, Secure Digital (SD) connectivity, and the like.

In this configuration, the SoC 200 includes various processing cores that support multiple operations. For the configuration shown in FIG. 2, the SoC 200 includes a multi-core central processing unit (CPU) 202, a graphics processor unit (GPU) 204, a digital signal processor (DSP) 206, and a neural processor unit (NPU) 208. The SoC 200 may also include a sensor processor 214, image signal processors (ISPs) 216, a navigation module 220, which may include a global positioning system, and a memory 218. The multi-core CPU 202, the GPU 204, the DSP 206, the NPU 208, and the multi-media engine 212 support various functions such as video, audio, graphics, gaming, artificial networks, and the like. Each processor core of the multi-core CPU 202 may be a reduced instruction set computing (RISC) machine, an advanced RISC machine (ARM), a microprocessor, or some other type of processor. The NPU 208 may be based on an ARM instruction set.

FIG. 3A is a block diagram of a logic assembly 300 showing an AND gate with a delay logic inverter device, according to aspects of the present disclosure. The logic assembly 300 has an a input and a b input to a dual input AND gate 304. The b input includes an inverted delay logic 302, where $\delta_{path}$ represents a delay in the b input path. As shown in the timing diagram of FIG. 3B, the b input is delayed in switching by δ. As a result of the unbalanced paths, a pulse of the same width as δ may appear on the output. FIG. 3A thus shows an AND gate 304 where both inputs a and b, while initially at opposite levels, are toggled. However, due to the unbalanced paths, the output momentarily rises to one before settling to the correct level.

FIG. 3B is a timing diagram showing a glitch on a signal waveform, according to aspects of the present disclosure. In FIG. 3B the second input signal b is delayed by $δ_{path}$ and the result is delayed switching on the output signal.

FIG. 4A is a block diagram showing a segment of a flip-flop hold logic 400, according to aspects of the present disclosure. FIG. 4B is a block diagram showing a clocked D flip-flop 406, according to an aspect of the present disclosure. Both the flip-flop hold logic 400 and the clocked D flip-flop 406 have logic inputs 402. These logic inputs 402 may introduce glitches into the logic stream and affect all the downstream logic, both synchronous and asynchronous. The flip-flop hold logic 400 also contains multiple NAND gates 404a and 404b, whose outputs serve as an input to one another. Glitches may be captured by either flip-flops or latches.

Figure 5A:
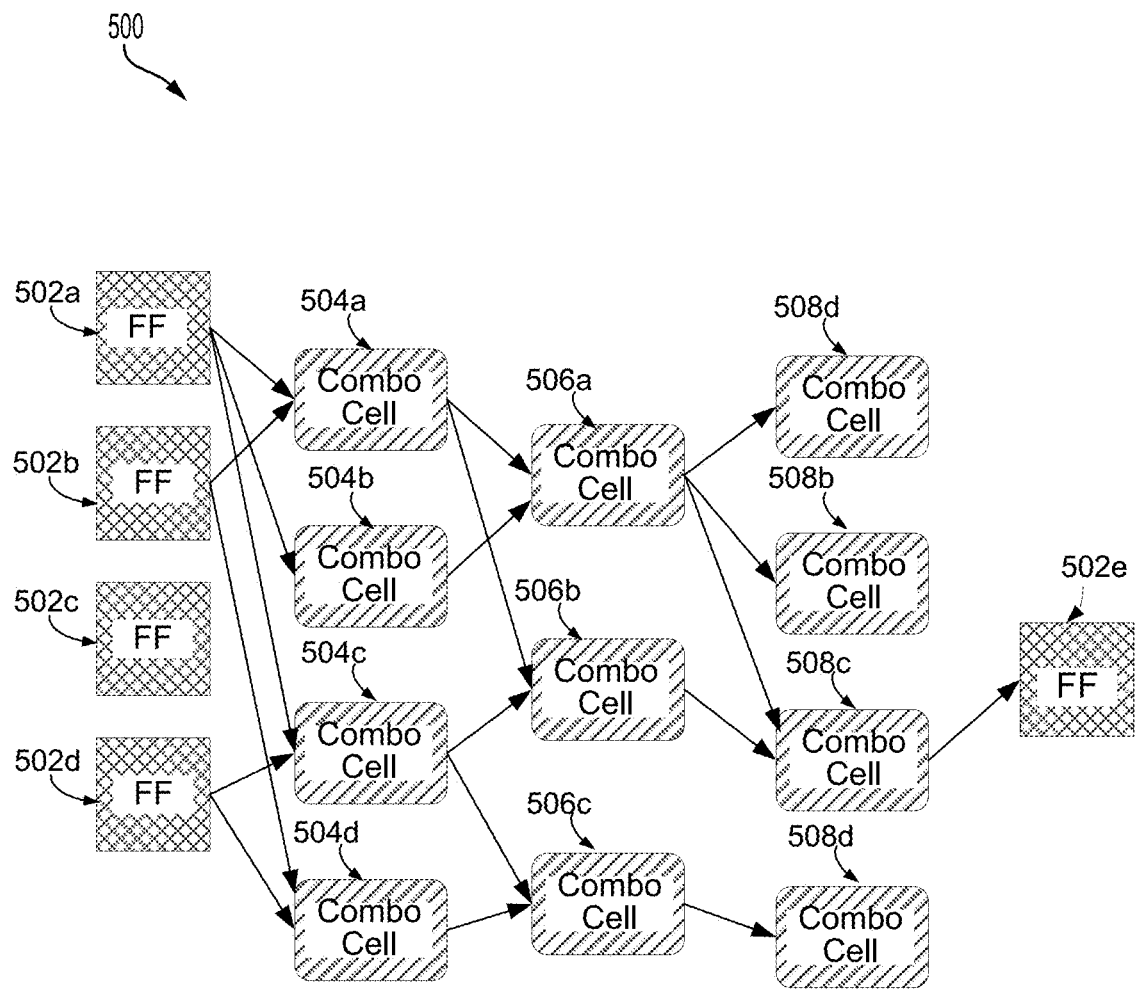
FIG. 5A is a block diagram showing a logic cone having multiple cells propagating glitches, according to aspects of the present disclosure.
Figure 5B:
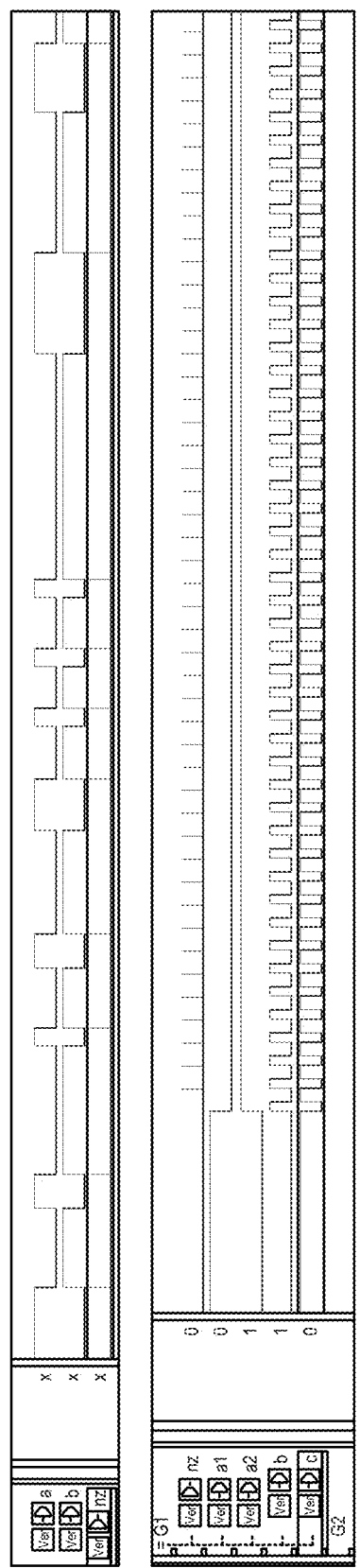
FIG. 5B is a timing diagram depicting the appearance of glitches on signals on a digital signal analyzer, according to aspects of the present disclosure.

FIG. 5A is a block diagram showing a fanout cone 500 having multiple cells propagating glitches, according to aspects of the present disclosure. Some data path centric blocks may be highly prone to glitches that build up and down the fanout cone 500. The fanout cone 500 includes multiple digital logic blocks that may include first flip-flops 502a-502d, first combination cells 504a-504d, second combination cells 506a-506c, third combination cells 508a-508d, and a second flip-flop 502e. The outputs of the flip-flops 502a-d are glitch free by construction, however, glitches may build up and down the fanout cone 500, as shown in the plots in FIG. 5B.

The fanout cone 500 may produce glitches at any of the digital logic blocks of FIG. 5A. The plot of FIGURE B shows how the glitches appear when the signal is analyzed by a digital signal analyzer. The glitches appear as out of synchronization switching on FIG. 5B.

FIG. 6A is a block diagram illustrating a cell concept of a glitch absorbing buffer (GABUF) 600, according to aspects of the present disclosure. The GABUF 600 is a single input logic gate. Internally, the GABUF 600 splits the input signal into two versions, one of which is delayed. The amount of the delay between the two inputs defines the glitch time threshold, e.g., a pulse smaller than this delay is classified as a glitch. Pulses larger than the glitch time threshold are classified as valid signal pulses. The GABUF 600 buffers an input signal a and filters any glitches, preventing the glitches from appearing at an output z. A signal waveform in FIG. 6B shows the original input a and the output z. The GABUF 600 adjusts the timing by delaying one input to the logic element. The GABUF 600 identifies glitches based on timing differences and the result is that the filtered glitch bandwidths are hardcoded into the logic cell. FIG. 6B is a timing diagram showing a glitch on a signal waveform, according to aspects of the present disclosure. The timing delay is noted as $δ_{glitch}$ in the signal waveform diagram of FIG. 6B. During the design process, the GABUFs 600 may be added based on the path lengths that produce glitches. As illustrated in FIG. 6B, the original input signal a with a $δ_{glitch}$ is filtered by the GABUF 600 to produce the clean output signal waveform z.

FIG. 7 is a timing diagram showing a timing delay on a signal affected by a glitch, according aspects of the present disclosure. The GABUF 600 imposes a time delay td from the input a to the output z of the GABUF 600, as shown in FIG. 7. This time delay affects input signal a and shifts it later in time so that the desired switching occurs synchronously.

Figures 8A, 8B:
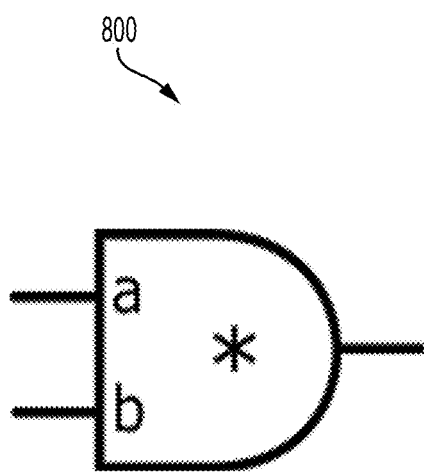
FIG. 8A illustrates a C-element of a glitch absorbing buffer (GABUF) block diagram, according to aspects of the present disclosure.
FIG. 8B shows the truth table of a glitch absorbing buffer (GABUF), according to aspects of the present disclosure.

FIG. 8A illustrates a C-element of a GABUF block diagram, according to aspects of the present disclosure. FIG. 8A depicts a C-element 800, one implementation of the GABUF 600, according to aspects of the present disclosure. For the implementation shown in FIG. 8A, the C-element 800 is a gate with memory. The C-element 800 may also be known as a C-gate, hysteresis flip-flop, coincident flip-flop, or two-hand safety circuit. The C-element 800 is a small digital block widely used in the design of asynchronous circuits. In the theory of lattices, the C-element 800 is a semimodular distributive circuit whose operation in time is described by a Hasse diagram. The C-element 800 is defined by the equation:

$$Y_n = a \cdot b + (a+b) \cdot y_{n-1} \qquad (2)$$

FIG. 8B shows the truth table of a GABUF, according to aspects of the present disclosure. The Equation 2 corresponds to the truth table in FIG. 8B. As stated in the truth table, the output only toggles if both inputs agree. If both inputs do not agree then the previous state is kept. As a result of this logic, a glitch does not propagate out of the GABUF 600.

Figure 9A:
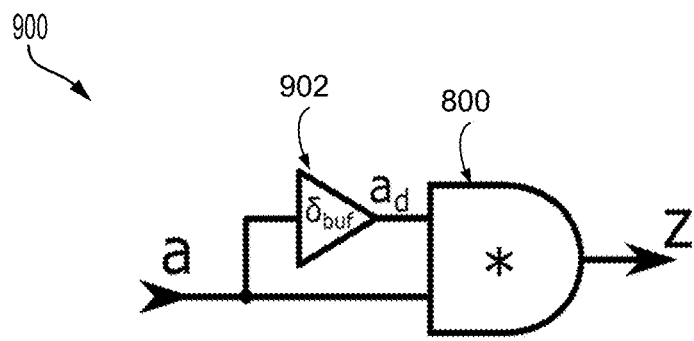
FIG. 9A is a cell schematic of a glitch absorbing buffer (GABUF), according to aspects of the present disclosure.
Figure 9B:
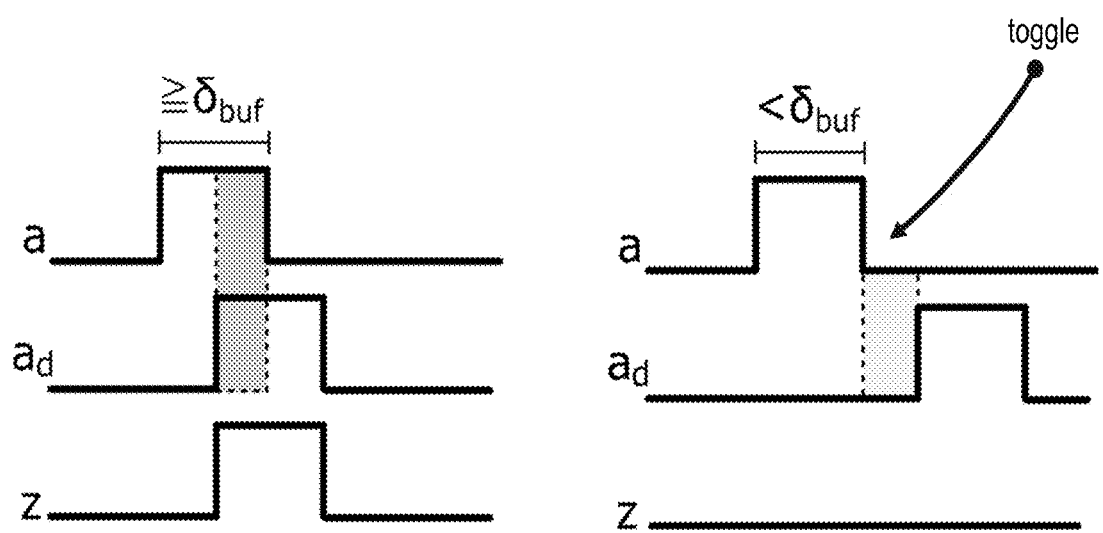
FIG. 9B is a timing diagram showing the effect of toggling the logic element in the glitch absorbing buffer (GABUF) of FIG. 9A, according to aspects of the present disclosure.

FIG. 9A is a cell schematic of a GABUF 900, according to aspects of the present disclosure. The GABUF 900 assembly includes the C-element 800 of FIG. 8A and a pulse delay ($δ_{BUF}$) 902, which represents the delay in the signal path. The inputs to the C-element 800 are input signals a and a delayed input signal $a_d$. The C-element 800 then produces an output signal z. FIG. 9B is a timing diagram showing the effect of toggling the logic element (e.g., C-element 800) in the GABUF 900, according to aspects of the present disclosure. The signaling waveforms in FIG. 9B show the relationship between an input signal a, which is not delayed, and an input signal $a_d$, which is a delayed version of signal a. If the input pulse width is smaller than the pulse delay $δ_{BUF}$ 902, then there is no overlap between signal a and signal $a_d$, and the C-element 800 does not toggle. If the input pulse width is larger than the pulse delay $δ_{BUF}$ 902, then the C-element 800 will toggle, as shown in the signal waveforms in FIG. 9B. Therefore, the pulse delay $δ_{BUF}$ 902 defines the threshold between a glitch and a non-glitch pulse.

Figures 10A, 10B:
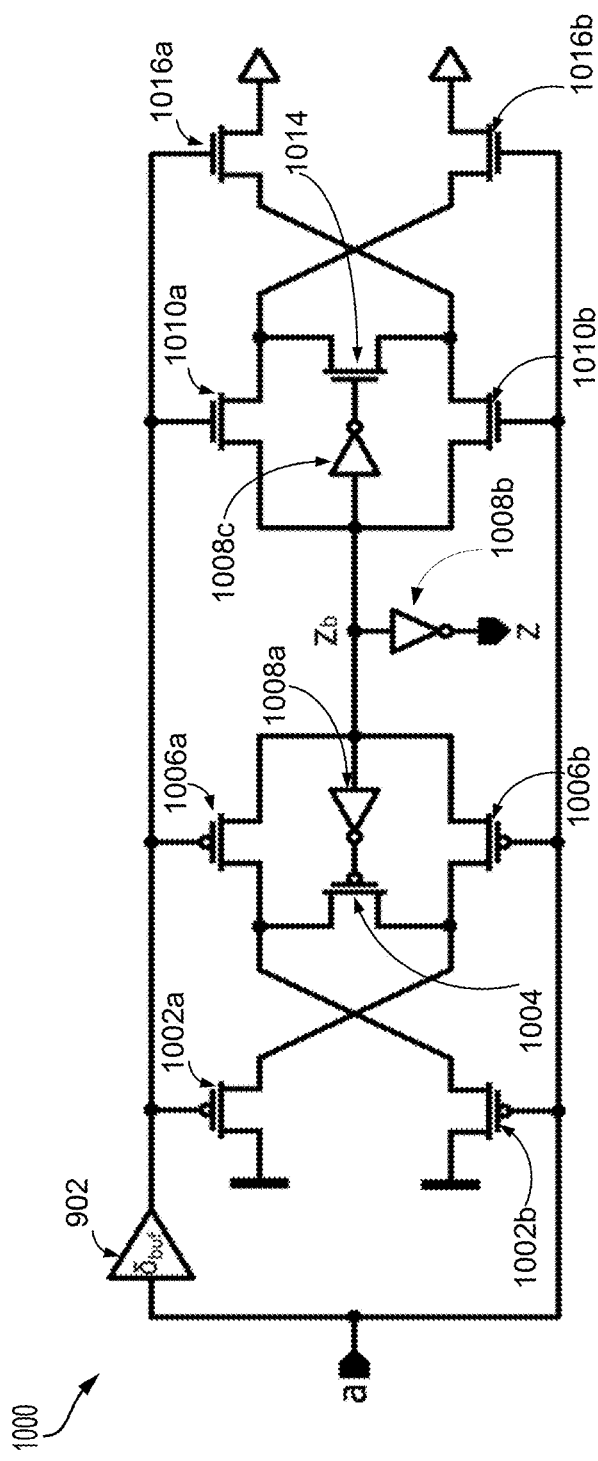
FIG. 10A is a block diagram showing a further cell schematic of a glitch absorbing buffer (GABUF), according to aspects of the present disclosure.
FIG. 10B is a timing diagram showing the effect of toggling the logic element in the glitch absorbing buffer (GABUF) of FIG. 10A on both input signals and the resulting output signal, according to aspects of the present disclosure.

FIG. 10A is a block diagram showing a further cell schematic of a glitch absorbing buffer (GABUF), according to aspects of the present disclosure. A GABUF assembly 1000 includes an input signal a with an upper branch having a pulse delay $δ_{BUF}$ 902. The input signal a may be routed to a complementary metal oxide semiconductor (CMOS) transistor 1002b, while a second input signal is affected by the pulse delay $δ_{BUF}$ 902 and arrives at a CMOS transistor 1002a after a delay period. The CMOS transistor 1002a provides input to CMOS transistors 1004 and 1006b. A CMOS transistor 1002b provides input to CMOS transistors 1004 and 1006a. The CMOS transistor 1004 outputs to a logic inverter 1008a. The logic inverter 1008a is in communication with logic inverters 1008b and 1008c. The logic inverter 1008b provides an output signal $z_b$. The design is mirrored with a logic inverter 1008c connected to a logic inverter 1014. A CMOS transistor 1010a is connected to the pulse delay $δ_{BUF}$ 902 as are CMOS transistors 1006a and 1016a. A CMOS transistor 1010b is similarly connected to the input signal along with the CMOS transistor 1006b. The CMOS transistor 1010a is connected to the CMOS transistor 1016b and the CMOS transistor 1010b is connected to the CMOS transistor 1016a. The GABUF assembly 1000 identifies if there is an overlap in signal timing.

FIG. 10B is a timing diagram showing the effect of toggling the logic element in the GABUF assembly 1000 on both input signals and the resulting output signal, according to aspects of the present disclosure. The signal waveforms in FIG. 10B depict the overlap of signals that allows the delayed signal $\delta_{BUF}$ to propagate through the logic cone 500. The total delay from a to z is $\delta_{BUF}$ plus a C-element propagation delay td*. The relationship between input signals a and $a_d$ may take several forms. For example, if an amount of signal overlap is greater than an amount $\delta_{glitch}$, then the $a_d$ signal is time shifted by an amount $\delta_{BUF}$, as is the corresponding output signal z. If $\delta_{glitch}$ is greater than the input signal, then there is no overlap in signals and based on the truth table in FIG. 8B, there is no output change. This will occur regardless of the amount of overlap. If there is a small overlap, or the signal is equal to $\delta_{glitch}$ then the signal output will switch, based on the truth table of FIG. 8B. The amount of the time shift is the amount of small overlap. The output will be delayed by $\delta_{BUF}$ plus the logic element or C-element propagation delay time.

The operation of the GABUF 1000 may be described as an enhanced buffer design that also filters glitches. The filtered pulse width is set by the internal buffer delay. The amount of overlap between input signals a and $a_d$ determines if the pulse is propagated. If the pulse is wider or equal to $\delta_{BUF}$, there is overlap and output signal z toggles. If the pulse is smaller than $\delta_{BUF}$, there is no overlap and output signal z does not toggle.

Figure 11A:
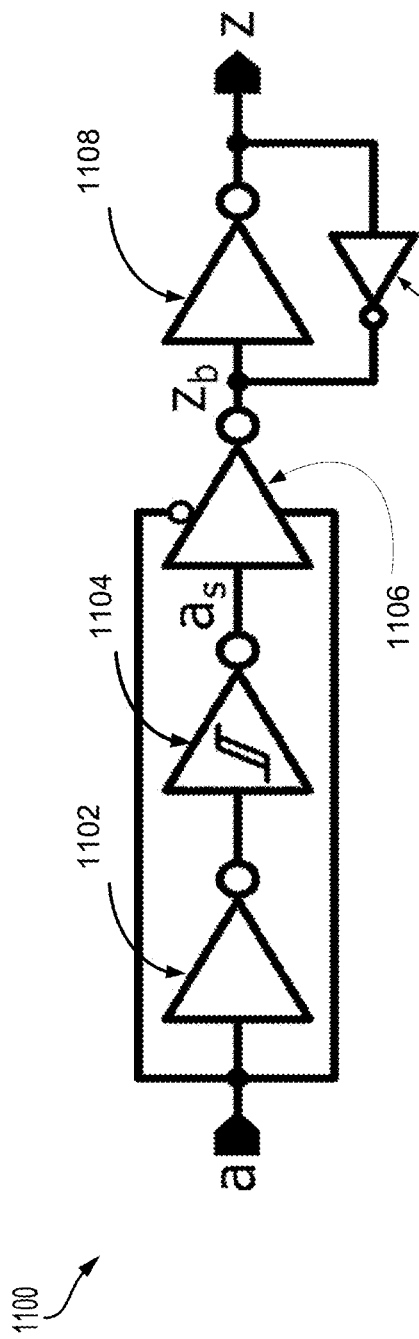
FIG. 11A is a block diagram showing an alternative implementation of a glitch absorbing buffer (GABUF), according to aspects of the present disclosure.

FIG. 11A is a block diagram showing an alternative implementation of a GABUF 1100, according to aspects of the present disclosure. This aspect enhances the low pass behavior on input. In this aspect, a Schmitt trigger 1104 is employed. A Schmitt trigger is a comparator circuit with hysteresis that is implemented by applying positive feedback to the non-inverting input of a comparator or differential amplifier. It is an active circuit that converts an analog input signal to a digital output signal. The circuit is called a trigger because the output retains its value until the input changes sufficiently to trigger a change. In the non-inverting configuration, when the input is higher than a chosen threshold, the output is high. When the input is below a lower chosen threshold the output is low, and when the input is between the two levels the output retains its value. This aspect incorporates an inverting trigger and takes its output from an inverter 1102 and outputs to the Schmitt trigger 1104. The Schmitt trigger 1104 outputs to a second inverter 1106. The use of a Schmitt trigger 1104 improves the low pass behavior on the input because pulses smaller than the input signal do not cause a glitch response. The second inverter 1106 provides input to a third inverter 1108, also known as a keeper inverter, which acts to keep signal a low and which is combined with output signal $z_b$ and input to the inverter 1110 to produce output signal z.

Figure 11B:
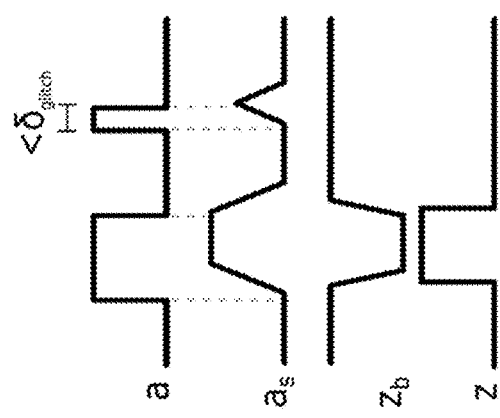
FIG. 11B is a timing diagram showing the effect of toggling the logic element in the glitch absorbing buffer (GABUF) of FIG. 11A, incorporating a Schmitt trigger on both input signals and the resulting output signal, according to aspects of the present disclosure.

FIG. 11B is a timing diagram showing the effect of toggling the logic element in the GABUF 1100 incorporating a Schmitt trigger on both input signals and a resulting output signal, according to aspects of the present disclosure. In this aspect, the output voltage is equal to the shared voltage and both output levels stay away from the supply rails. This behavior is shown in the signal diagram of FIG. 11B. A signal a is shown to have a glitch of width less than $\delta_{glitch}$. Because of the smaller size of this glitch, the logic elements do not have time to fully switch, resulting in an altered signal $a_s$, shown as a smaller peak in the signal diagram of FIG. 11B. The signal $a_s$ is the output from the Schmitt trigger 1104. The signal $z_b$ is the sum of the inverted output of the inverter 1106 and the inverted output of the inverters 1108 and 1110. The alternate aspect of the GABUF 1100 acts to filter everything below the threshold, thus producing the output signal z, with no glitch. This aspect may be especially suitable for designs that benefit from amplified low pass behavior.

Figure 12A:
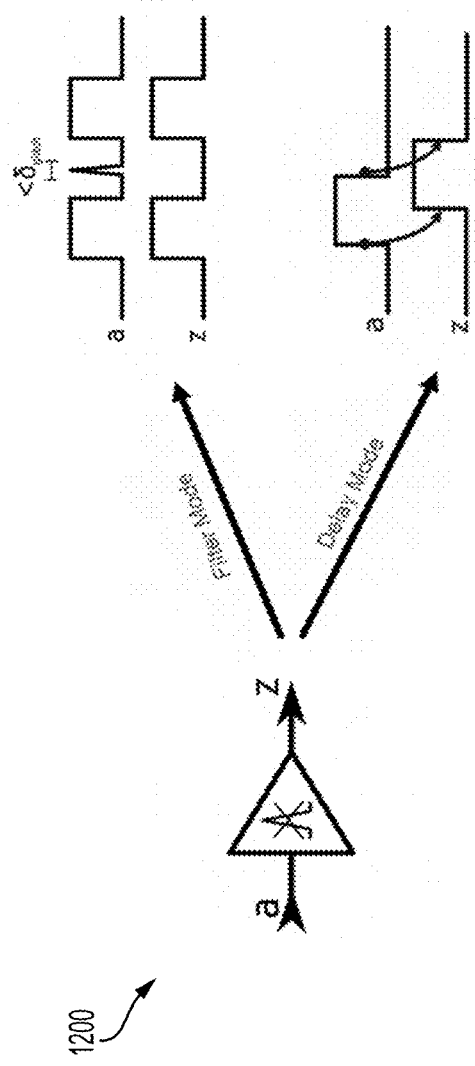
FIG. 12A is a block diagram showing effects of a glitch absorbing buffer (GABUF), according to aspects of the present disclosure.

FIG. 12A is a block diagram showing effects of a glitch absorbing buffer (GABUF), according to aspects of the present disclosure. FIG. 12A is a block diagram illustrating how a GABUF 1200 effectively acts as a comparator. If a pulse is too small, then that pulse is considered to be a glitch and is not propagated. If a pulse is large enough, then the pulse is considered a logic signal and is propagated. The GABUF 1200 acts in filter mode to reduce or eliminate narrow glitches and in delay mode on larger glitches where there is an overlap on transitional states. The effect of glitch removal is shown in the signal waveforms in FIG. 12A, which show glitches removed. The signal waveforms show that when the GABUF 1200 operates in filter mode, glitches that appear are filtered out in between switching. FIG. 12A shows an input signal a with $\delta_{glitch}$ between switching operations. When the GABUF 1200 operates in delay mode, signals such as a are shifted so that switching occurs synchronously.

Figure 12B:
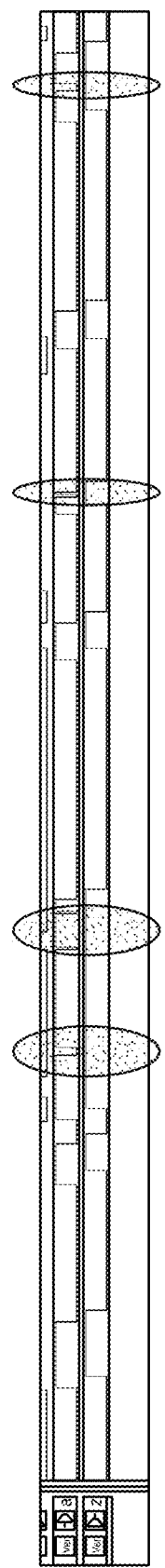
FIG. 12B is a timing diagram depicting the appearance of signals on a digital signal analyzer after glitch absorbing buffer (GABUF) processing, according to aspects of the present disclosure.

FIG. 12B is a timing diagram depicting the appearance of signals on a digital signal analyzer after GABUF processing, according to aspects of the present disclosure. The circled areas show a glitch on the upper trace in the digital signal analyzer diagram and removal of the glitch on the lower trace in the digital signal analyzer diagram.

The design process may take into account the possibility that correcting a glitch in one component may propagate glitches downstream. Inserting a GABUF to eliminate a glitch at the output of a specific cell may unbalance the input path to the following logic cell. This introduced timing imbalance may also produce a glitch. The glitch absorbing buffer is added so that it does not adversely affect the timing of the logic cone downstream to create more glitches in the design, which may specify multiple timing simulations during the design process.

Figure 13:
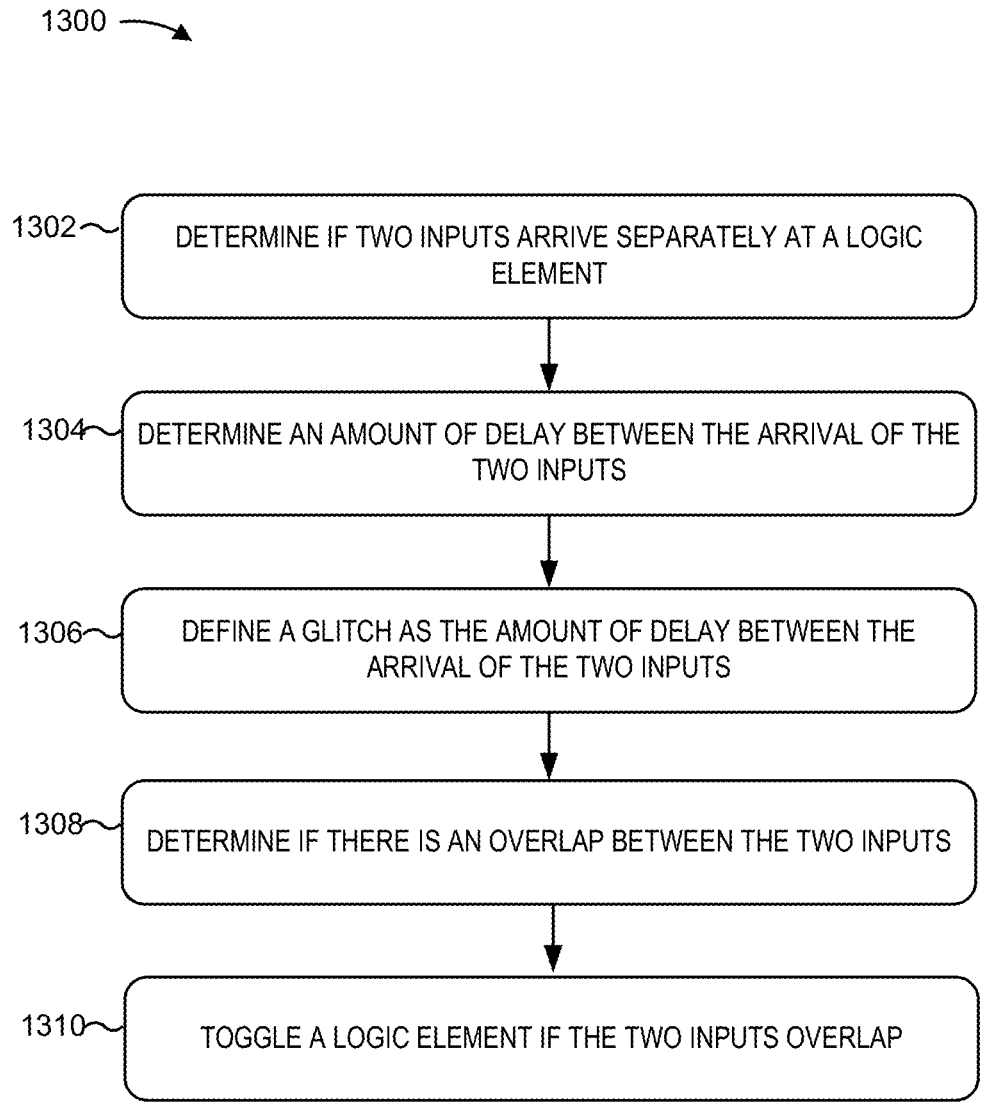
FIG. 13 is a flow chart of the operation of a glitch absorbing buffer (GABUF), according to aspects of the present disclosure.

FIG. 13 is a flow chart of the operation of a glitch absorbing buffer (GABUF), according to aspects of the present disclosure. FIG. 13 depicts a simplified flowchart 1300 of a method for absorbing glitches using a glitch absorbing buffer. At block 1302, a determination is made if two inputs arrive separately at a logic element, such as logic elements 302-308 of FIG. 3. In one aspect, the GABUF receives an input signal and internally creates a delayed version of the input signal. The delayed version is then compared with the original signal using a logic element. Thus, in block 1304, a determination of an amount of delay between the arrival of the two inputs is made. In block 1306, a glitch is defined as the amount of delay between the arrival of the two inputs. This delay is defined as $\delta_{BUF}$, as shown in FIG. 7. Then, in block 1308, it is determined if there is an overlap between the two input signals, as shown in FIG. 10B. If the two input signals overlap, in block 1310, a logic element is toggled. As shown in FIG. 8A, a logic element, such as the C-element 800, thus delays an earlier arriving signal, shifting the signal, and absorbing the glitch.

According to one aspect of the present disclosure, a glitch absorbing buffer is described. The glitch absorbing buffer includes means for determining if two inputs arrive separately at a logic element. Additional aspects provide means for determining an amount of the delay between the arrival of the two inputs at a logic element. Once the amount of delay has been determined a means for determining if there is an overlap and determines any overlap between the two input signals. If there is an overlap between the two input signals, a further means for toggling a C-element toggles the C-element.

Figure 14:
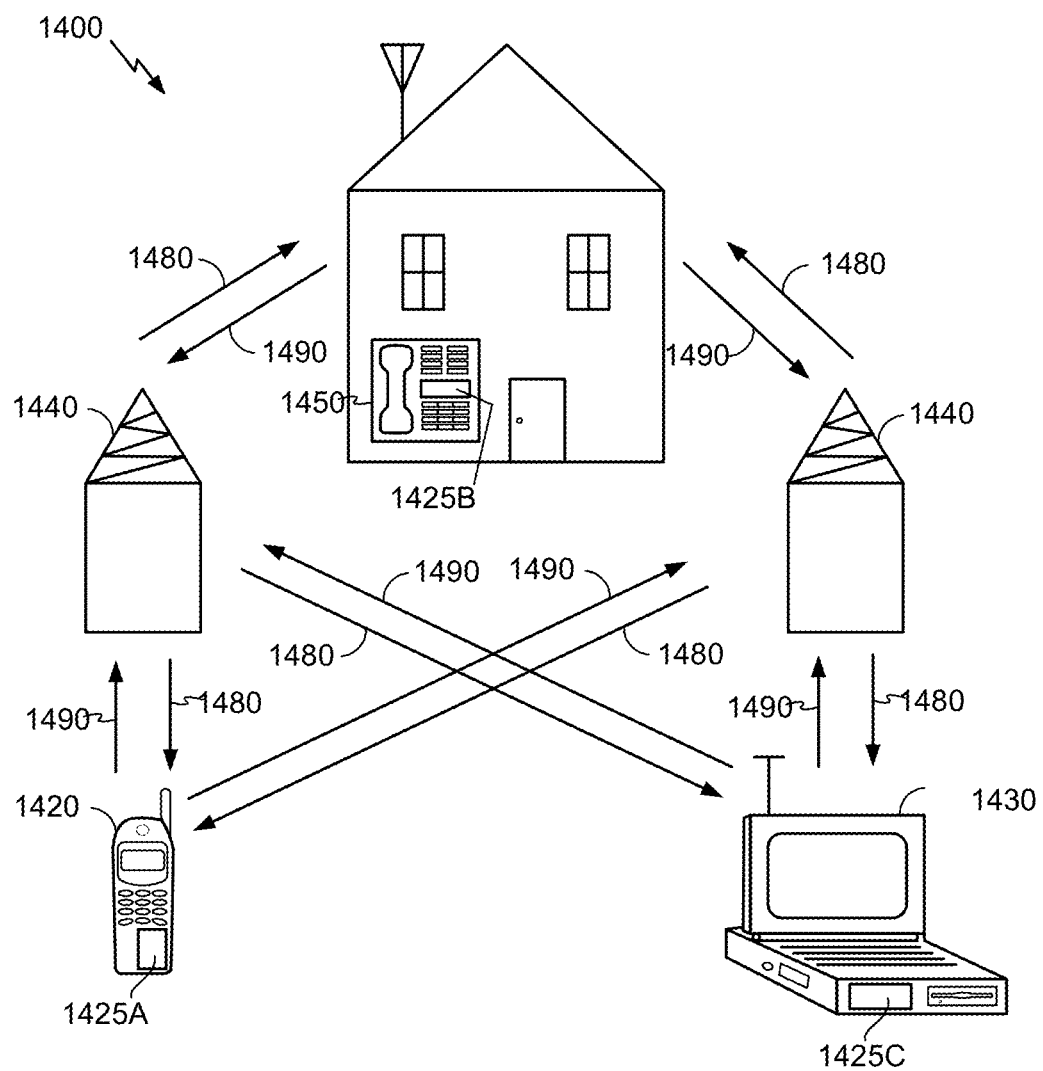
FIG. 14 is a block diagram showing exemplary electronic devices in which a configuration of the disclosure may be advantageously employed a according to aspects of the present disclosure.

FIG. 14 is a block diagram showing exemplary electronic devices in which a configuration of the disclosure may be advantageously employed a according to aspects of the present disclosure. For purposes of illustration, FIG. 14 shows three remote units 1420, 1430, and 1450 and two base stations 1440. It will be recognized that wireless communications systems may have many more remote units and base stations. Remote units 1420, 1430, and 1450 include IC devices 1425A, 1425B, and 1425C that include the disclosed GABUF. It will be recognized that other devices may also include the disclosed GABUF, such as the base stations, switching devices, and network equipment. FIG. 14 shows forward link signals 1480 from the base station 1440 to the remote units 1420, 1430, and 1450 and reverse link signals 1490 from the remote units 1420, 1430, and 1450 to base station 1440.

In FIG. 14, remote unit 1420 is shown as a mobile telephone, remote unit 1430 is shown as a portable computer, and remote unit 1450 is shown as a fixed location remote unit in a wireless local loop system. For example, a remote unit may be a mobile phone, a hand-held personal communications systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieves data or computer instructions, or combinations thereof. Although FIG. 14 illustrates remote units according to the aspects of the disclosure, the disclosure is not limited to these exemplary illustrated units. Aspects of the disclosure may be suitably employed in many devices, which include the GABUF.

For a firmware and/or software implementation, the methodologies may be implemented with modules (e.g., procedures, functions, and so on) that perform the functions described. A machine-readable medium tangibly embodying instructions may be used in implementing the methodologies described. For example, software codes may be stored in a memory and executed by a processor unit. Memory may be implemented within the processor unit or external to the processor unit. As used, the term "memory" refers to types of long term, short term, volatile, non-volatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communications apparatus. For example, a communications apparatus may include a transceiver having signals indicative of instructions and data. The instructions and data are configured to cause one or more processors to implement the functions outlined in the claims.

The various illustrative logical blocks, modules, and circuits described in connection with the disclosure may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

Although the present disclosure and its advantages have been described in detail, it should be understood that various changes, substitutions, and alterations can be made without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described may be utilized according to the present disclosure. Accordingly, the appended claims are intended to include within their scope such processes, machines, manufacture, compositions of matter, means, methods, or steps.

What is claimed is:

1. A glitch absorbing buffer, comprising:
   a logic element comprising an inverter and an AND gate, configured to identify a digital logic glitch; and
   a delay circuit in communication with the logic element, in which the delay circuit is configured to input a signal to a first input of the AND gate and input an inverted, delayed version of the signal to a second input of the AND gate, and to output a pulse having a width equal to the digital logic glitch.

2. The glitch absorbing buffer of claim 1, in which the logic element configured to identify the digital logic glitch is a C-element.

3. The glitch absorbing buffer of claim 2, in which the C-element is configured to determine an overlap between the first input and a second input to the logic element.

4. The glitch absorbing buffer of claim 3, in which the C-element is configured to toggle an output signal when a filtered pulse width is wider than or equal to an amount of delay ($\delta_{BUF}$).

5. The glitch absorbing buffer of claim 3, in which the C-element is configured not to toggle an output signal when a filtered pulse width is less than an amount of delay ($\delta_{BUF}$).

6. The glitch absorbing buffer of claim 1, further comprising an internal buffer delay configured to determine a filtered pulse width.

7. The glitch absorbing buffer of claim 1, in which the logic element configured to identify a digital logic glitch incorporates a Schmitt trigger.

8. The glitch absorbing buffer of claim 7, in which the Schmitt trigger is configured to compare a pulse width with the glitch.

9. The glitch absorbing buffer of claim 8, in which the Schmitt trigger is configured to toggle when the pulse width is equal to or greater than an amount of delay ($\delta_{BUF}$).

10. A method of reducing glitch power in digital logic, comprising:
   determining whether two inputs arrive separately at a logic element, the two inputs comprising an original input and a delayed version of the original input;
   determining an amount of delay between an arrival of the two inputs at the logic element when the two inputs arrive separately;
   defining a pulse width as an amount of delay ($\delta_{BUF}$) between the arrival of the two inputs;
   determining whether there is an overlap in the arrival between the two inputs; and
   toggling the logic element when the two inputs overlap in the arrival, in which the toggling inputs an inverted and delayed version of the original input to the logic element.

11. The method of claim 10, further comprising comparing a pulse width with the glitch and toggling the logic element when the pulse width is equal to or greater than the amount of delay ($\delta_{BUF}$).

12. The method of claim 11, in which the logic element toggles only when the two inputs agree in value, both high or both low.

13. The method of claim 12, further comprising keeping a previous state when the two inputs do not agree in value.

14. The method of claim 10 further comprising:
   operating a glitch absorbing buffer in a delay mode where there is the overlap in arrival on transitional states; and
   operating the glitch absorbing buffer in a filter mode on narrow glitches that do not overlap on transitional states.

15. A glitch absorbing buffer, comprising:
   means for identifying a digital logic glitch; and
   means for selectively inverting and delaying one input to the means for identifying.

16. The glitch absorbing buffer of claim 15, further comprising means for determining an overlap between the one input and a second input.

17. The glitch absorbing buffer of claim 15, further comprising means for determining a filtered pulse width.

18. The glitch absorbing buffer of claim 15, in which the means for identifying a digital logic glitch incorporates a Schmitt trigger.

19. The glitch absorbing buffer of claim 18, further comprising means for comparing a pulse width with the digital logic glitch.

20. The glitch absorbing buffer of claim 19, further comprising means for toggling when the pulse width is equal to or greater than an amount of delay.

* * * * *